(12) United States Patent
Wang et al.

(10) Patent No.: US 6,699,792 B1
(45) Date of Patent: Mar. 2, 2004

(54) POLYMER SPACERS FOR CREATING SMALL GEOMETRY SPACE AND METHOD OF MANUFACTURE THEREOF

(75) Inventors: Fei Wang, San Jose, CA (US); Lu You, San Jose, CA (US); Lynne Okada, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 79 days.

(21) Appl. No.: 09/907,398

(22) Filed: Jul. 17, 2001

(51) Int. Cl.$^7$ ............................................. H01L 21/311
(52) U.S. Cl. ....................... 438/696; 438/695; 438/710; 438/700; 438/734
(58) Field of Search ................. 438/696, 706, 438/719, 695, 692, 734, 624, 710, 700

(56) References Cited

U.S. PATENT DOCUMENTS

| | | | | | |
|---|---|---|---|---|---|
| 4,330,384 A | * | 5/1982 | Okudaira et al. | ...... | 204/192.37 |
| 4,333,793 A | * | 6/1982 | Lifshitz et al. | ............. | 438/695 |
| 4,529,860 A | * | 7/1985 | Robb | ..................... | 219/121.41 |
| 4,636,281 A | * | 1/1987 | Buiguez et al. | ............. | 438/426 |
| 4,707,218 A | * | 11/1987 | Giammarco et al. | ........ | 438/421 |
| 4,838,991 A | * | 6/1989 | Cote et al. | ..................... | 216/46 |
| 5,017,403 A | * | 5/1991 | Pang et al. | ................. | 427/576 |
| 5,116,460 A | * | 5/1992 | Bukhman | .................. | 438/696 |
| 5,294,296 A | * | 3/1994 | Yoon et al. | ................. | 438/696 |
| 5,459,099 A | * | 10/1995 | Hsu | ............................ | 216/46 |
| 5,750,441 A | * | 5/1998 | Figura et al. | ............... | 438/751 |
| 5,882,535 A | * | 3/1999 | Stocks et al. | ................. | 216/18 |
| 5,932,491 A | * | 8/1999 | Wald et al. | ................. | 438/734 |
| 6,140,171 A | * | 10/2000 | Allen et al. | ................. | 438/230 |
| 6,168,726 B1 | * | 1/2001 | Li et al. | ........................ | 216/79 |
| 6,207,583 B1 | * | 3/2001 | Dunne et al. | ................ | 438/725 |
| 6,294,314 B1 | * | 9/2001 | Liao | ............................. | 430/313 |
| 6,326,302 B1 | * | 12/2001 | Joubert et al. | .............. | 438/638 |
| 6,331,380 B1 | * | 12/2001 | Ye et al. | ..................... | 430/318 |
| 6,350,675 B1 | * | 2/2002 | Chooi et al. | ................ | 438/624 |
| 6,358,838 B2 | * | 3/2002 | Furusawa et al. | ........... | 438/622 |
| 6,388,226 B1 | * | 5/2002 | Smith et al. | ........... | 219/121.57 |
| 6,426,300 B2 | * | 7/2002 | Park et al. | ................... | 438/700 |
| 2002/0052125 A1 | * | 5/2002 | Shaffer et al. | .............. | 438/780 |
| 2002/0155639 A1 | * | 10/2002 | Ohtake et al. | ............... | 438/118 |

OTHER PUBLICATIONS

Fundamentals of Semiconductor Processing Technologies, El–Karch, Bajin, 1995 pp. 319–324.*

Thompson et. al. , "Etch Process Development for FLARE™0 for Dual Damascene Architecture using N2/O2 plasma" IITC, 1999, pp. 59–61.*

Kinetics of reactive ion etching of polymers in an oxygen plasma: the importance of direct reactive ion etching. Materials Research Society Symposium Proceedings (1994), 334(Gas–Phase and Surface Chemistry in Electronic Materials Processing), 433–8.*

* cited by examiner

Primary Examiner—Michael S. Lebentritt
Assistant Examiner—Michael K. Luhrs

(57) ABSTRACT

In forming an opening or space in a substrate, a layer of photoresist is provided on the substrate, and the photoresist is patterned to provide photoresist bodies having respective adjacent sidewalls. A polymer layer is provided on the resulting structure through a low temperature conformal CVD process. The polymer layer is anisotropically etched to form spacers on the respective adjacent sidewalls of the photoresist bodies. The substrate is then etched using the spacers as a mask.

3 Claims, 6 Drawing Sheets

POLYMER SPACERS FOR CREATING SMALL GEOMETRY SPACE AND METHOD OF MANUFACTURE THEREOF

BACKGROUND OF THE INVENTION

1. Field of the Invention

This invention relates generally to technology for forming small geometry spacers in semiconductor devices, and more particularly, to use of polymer spacers in such technology.

2. Discussion of the Related Art

As semiconductor device dimensions continue to decrease, problems arise in, for example, the formation of small geometry spaces, as illustrated with reference to FIGS. 1–9. As shown in FIG. 1, a layer of photoresist 20 is patterned to form photoresist bodies 22, 24 on a substrate 26 of, for example, silicon nitride, silicon dioxide, metal, polysilicon or the like, formed on a base layer 28, which substrate 26 is to have a space or opening formed therein. Current photoresist patterning technology limits the distance A between adjacent sidewalls 30, 32 of the photoresist bodies 22, 24 to a certain minimum (FIG. 1). When an anisotropic etch step is undertaken, using the photoresist bodies 22, 24 as a mask, the dimension A of the space 34 formed in the substrate 26 by such etching step is determined by the distance A between the sidewalls 30, 32 of the photoresist bodies 22, 24, limited, as pointed out about, by current photoresist patterning technology. Thus, the dimension A of the space 34 formed in the substrate 26 (FIG. 2) may well be greater than desired.

An attempt to overcome this problem is illustrated in FIGS. 3–6. As shown in FIG. 3, a substrate 40 in which a space or opening is to be formed is provided on a base layer 42. The substrate 40 has provided thereon an oxide layer 44, which in turn has a layer of photoresist 46, patterned into photoresist bodies 48, 50 thereon. An anisotropic etch step of the oxide layer 44 is undertaken, using the photoresist bodies 48, 50 as a mask (FIG. 4), to form oxide layer bodies 52, 54, typically of high aspect ratio. After removal of the photoresist 48, 50, an oxide layer 56 is provided over the resulting structure by chemical vapor deposition (FIG. 5), and an etching step is undertaken to form spacers 58, 60, 62, 64 on the respective sidewalls 66, 68, 70, 72 of the oxide bodies 52, 54 (FIG. 6). However, a number of problems exist in this process.

Initially, because of the high aspect ratio of the oxide bodies 52, 54, deposition of a properly conformal layer over the structure is problematical. Furthermore, typically, the portions 56A of the oxide layer 56 overlying the substrate 40 and the tops 57, 59 of the oxide bodies 52, 54 are substantially thicker than those portions 56B along the sidewalls 66, 68, 70, 72 of the oxide bodies 52, 54. When an anisotropic etch is undertaken to form spacers 58, 60, 62, 64 on the respective sidewalls 66, 68, 70, 72 of the oxide bodies 52, 54 (FIG. 6), the etching process must be continued for long enough to remove the entire thickness of the portions 56A from over the tops 57, 59 of the oxide bodies 52, 54 and from over the substrate 40. Even though an anisotropic etch is undertaken, a substantial amount of the oxide portions 56B on the sidewalls 66, 68, 70, 72 of the oxide bodies 52, 54 is also etched away, reducing the advantage which might have been obtained if the spacers 58, 60, 62, 64 were of full width.

A further problem is that upon an oxide layer 56 being provided on a low k body (oxide bodies 52, 54), the dielectric coefficient will drop. Additionally, there may exist interface problems between the spacers 58, 60, 62, 64 and oxide bodies 52, 54.

It will also be noted that a relatively large number of steps are required in practicing the above-described process.

FIGS. 7–9 illustrate an attempt to overcome the above described problems.

Again, a layer of photoresist 80 is patterned on a substrate 82 of, for example, silicon nitride, silicon dioxide, metal, polysilicon or the like (FIG. 7), to form photoresist bodies 84, 86. The substrate 82 is formed on a base layer 88, and the substrate 82 is again to have a space or opening formed therein. Prior to an etching step of the substrate 82, however, an oxide layer 90 is deposited on the structure by chemical vapor deposition (FIG. 8), with the idea that such oxide layer 90 will be anisotropically etched to form spacers 92, 94, 96, 98 on respective sidewalls 100, 102, 104, 106 of the photoresist bodies 84, 86, which would in turn determine a dimension B between the adjacent spacers 94, 96 which is smaller (FIG. 9) than the dimension A between the adjacent sidewalls 30, 32 of the photoresist bodies 22, 24 as shown above in FIG. 1. However, it has been found that because of the high temperature involved in the deposition of the oxide layer 90 on the structure of FIG. 3, i.e., 200–400° C. or more, the photoresist bodies 84, 86 will flow or otherwise be damaged, causing the entire process to fail, and also causing contamination of the oxide deposition chamber. Additionally, even if these problems could be overcome, it is problematical to simultaneously remove photoresist and oxide 92, 94, 96, 98 later in the process without damaging the underlying layer.

Therefore, what is needed is a process for overcoming the above problems in formation of small geometry spaces in semiconductor devices.

SUMMARY OF THE INVENTION

The present invention is a method of forming an opening in a substrate. Initially, a layer of photoresist is provided on the substrate, and the photoresist is patterned to provide at least first and second photoresist bodies having respective adjacent first and second sidewalls. A polymer layer is provided over the resulting structure in a low-temperature conformal CVD deposition process. The polymer layer is etched to form first and second spacers on the respective adjacent first and second sidewalls of the first and second photoresist bodies. The substrate is then etched using the first and second spacers as a mask.

The present apparatus includes a substrate, first and second photoresist bodies on the substrate and having respective first and second adjacent sidewalls, and first and second spacers comprising polymer material on the first and second respective adjacent sidewalls of the first and second photoresist bodies.

The present invention is better understood upon consideration of the detailed description below, in conjunction with the accompanying drawings. As will become readily apparent to those skilled in the art from the following description, there is shown and described an embodiment of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of an illustrative embodiment when read in conjunction with the accompanying drawings, wherein:

DETAILED DESCRIPTION

Figure 1:
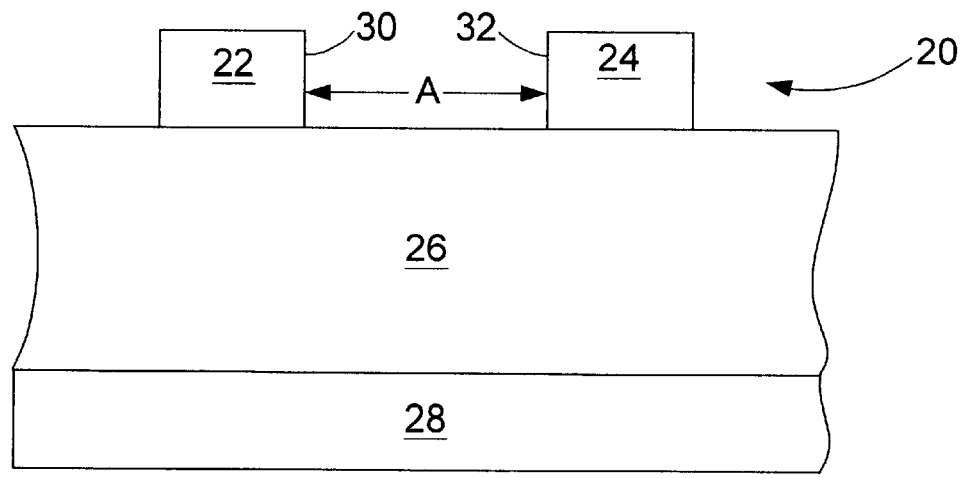
FIG. 1 is a sectional view of a semiconductor structure illustrating a first step in a prior art process for forming a space in a substrate.
Figure 2:
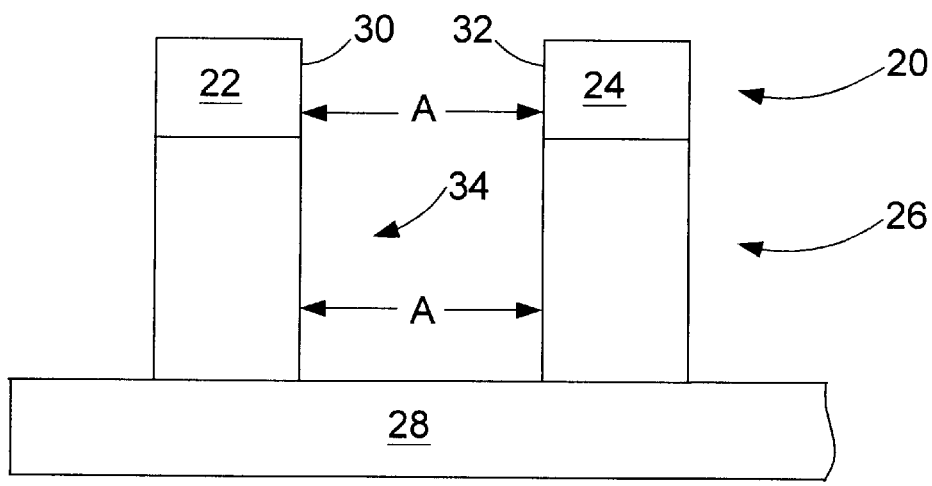
FIG. 2 is a sectional view similar to that shown in FIG. 1 and illustrating a further step in that prior art process.
Figure 3:
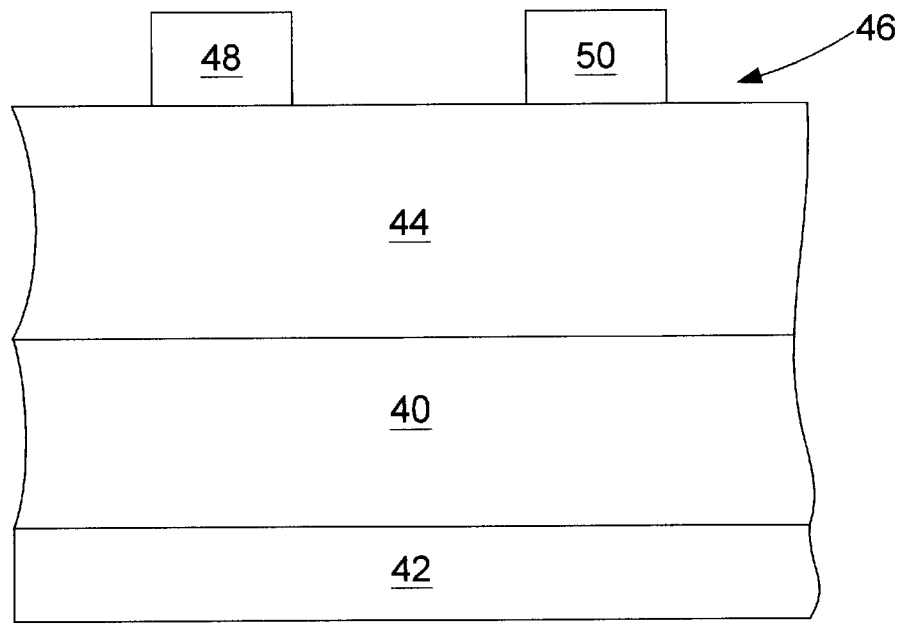
FIG. 3 is a sectional view of a semiconductor structure illustrating a first step in another prior art process for forming a space in a substrate.
Figure 4:
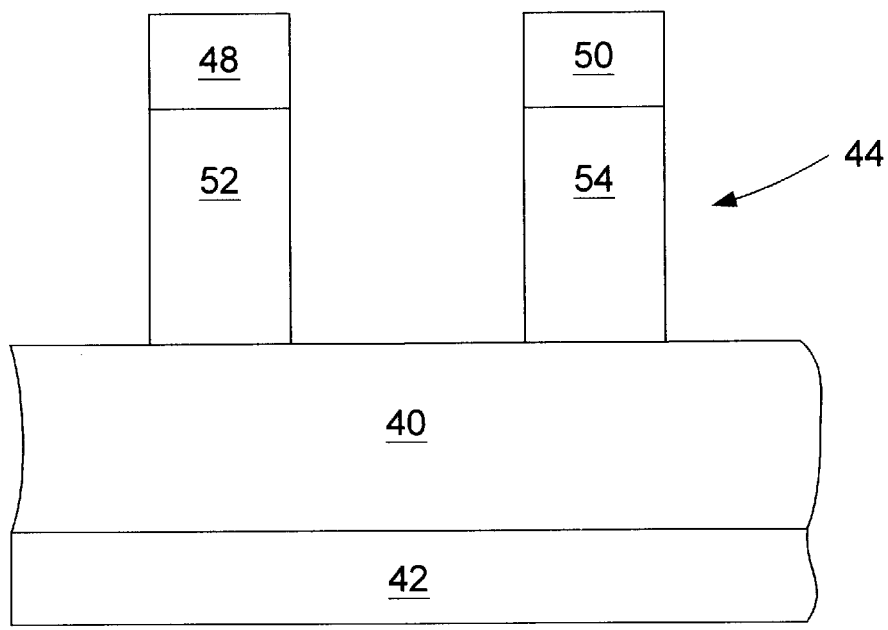
FIG. 4 is a sectional view similar to that shown in FIG. 3 and illustrating a further step in that process.
Figure 5:
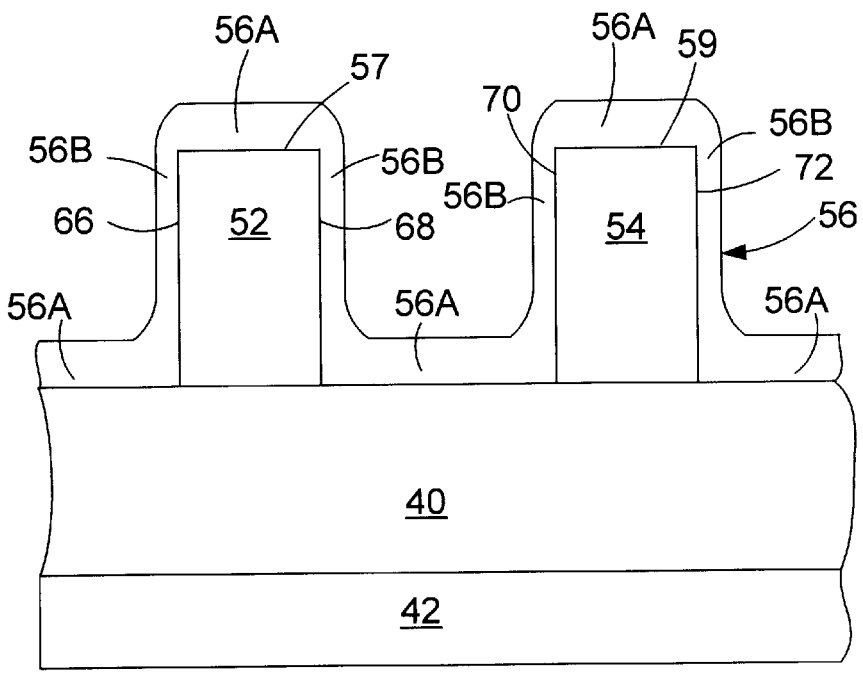
FIG. 5 is a sectional view similar to that shown in FIGS. 3 and 4 and illustrating a further step in that prior art process.
Figure 6:
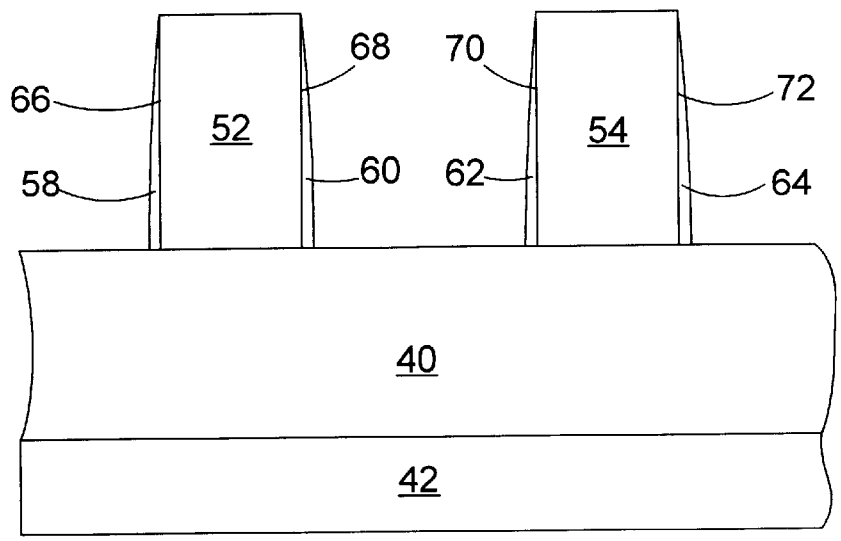
FIG. 6 is a sectional view similar to that shown in FIGS. 3–5 and illustrating a further step in that prior art process.
Figure 7:
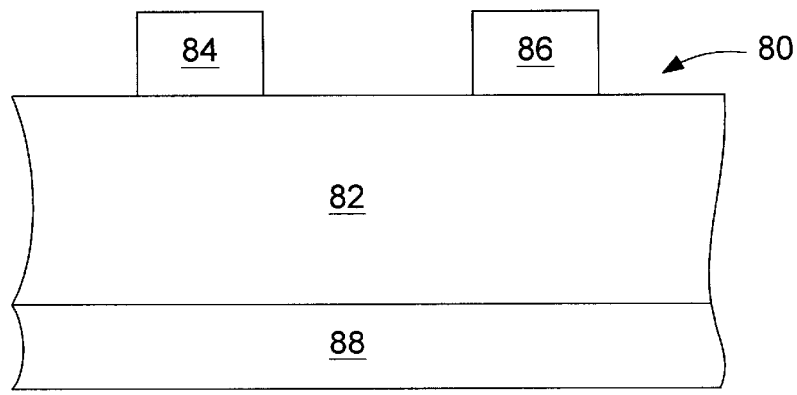
FIG. 7 is a sectional view of a semiconductor structure illustrating a first step in yet another prior art process for forming a space in a substrate.
Figure 10:
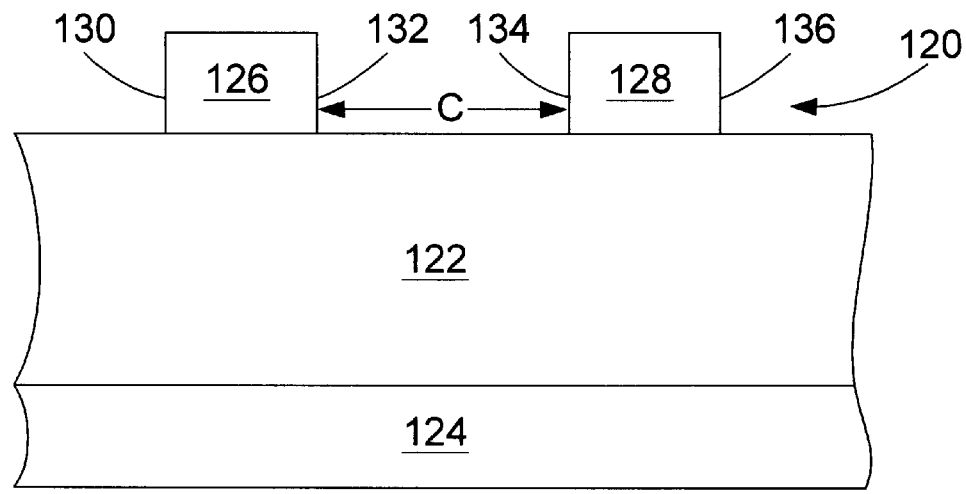
FIG. 10 is a sectional view of a semiconductor structure illustrating a first step in the process of the present invention.
Figure 11:
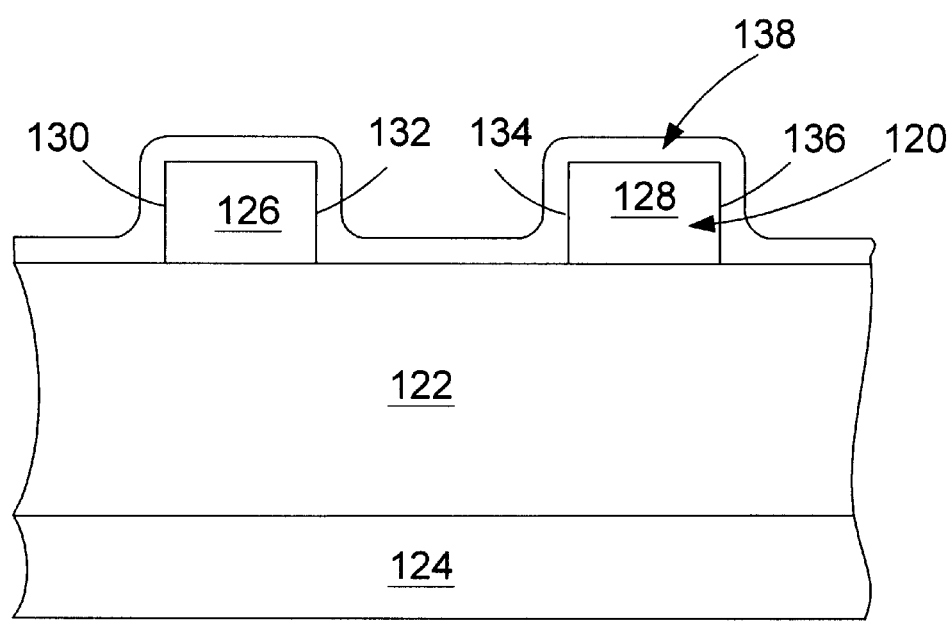
FIG. 11 is a sectional view similar to that shown in FIG. 10 illustrating a further step in the process of the present invention.

As shown in FIG. 10, similar to FIGS. 1 and 7, a layer of photoresist 120 is patterned on a planar surface of a substrate 122 of for example, silicon nitride, silicon dioxide, metal, polysilicon or the like, formed on a base layer 124, to form photoresist bodies 126,128. The photoresist body 126 on the planar surface of the substrate 122 includes sidewalls 130, 132, and the photoresist body 128 on the planar surface of the substrate 122 includes sidewalls 134,136. As described above, current photoresist patterning technology limits the distance between the adjacent sidewalls 132,134 of the respective adjacent photoresist bodies 126,128 to a certain minimum dimension C. With reference to FIG. 11, a layer of polymer material 138, for example, Epsilon 2002 from Dielectric Systems Inc., is conformally deposited over the resulting structure by chemical vapor deposition at a temperature in the range out from $-100°$ C. to $100°$ C., for example with advantage in the range of from $-10°$ C. to $-20°$ C. This temperature is substantially lower than that required for deposition of an oxide layer 90 over the structure as described above (FIG. 8), and avoids photoresist damage or flow.

Figure 12:
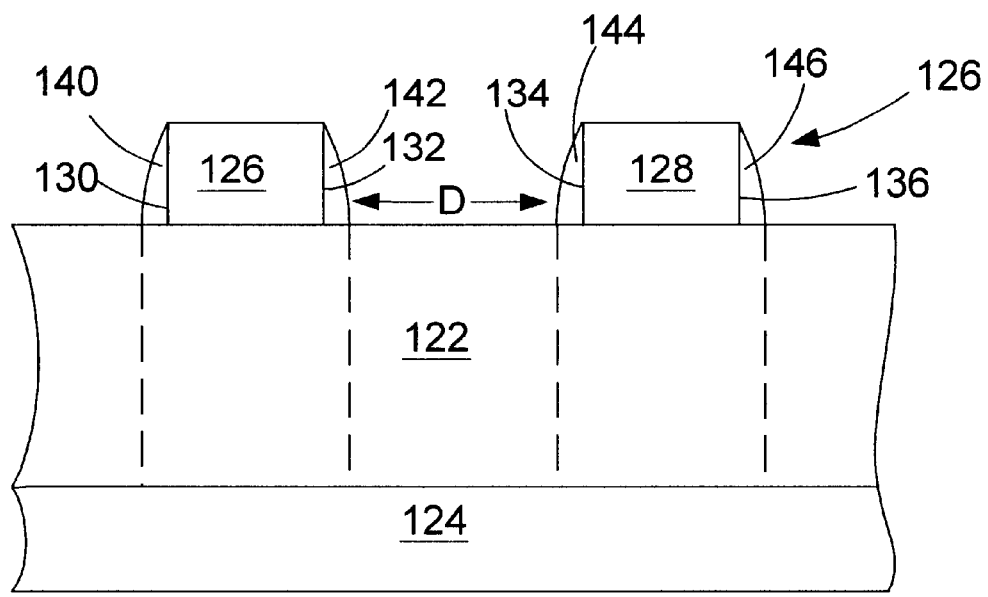
FIG. 12 is a sectional view similar to that shown in FIGS. 10 and 11 illustrating a further step in the process of the present invention.

Next, an anisotropic plasma etching step is undertaken (FIG. 12), using, for example, etchant comprising $O_2$ and $N_2$, or $O_2$, $N_2$ and Ar (along with for example $C_2H_4$, $C_2H_2$, and/or $NH_3$ as desired). As an alternative, the etchant may comprise $N_2$ and $H_2$ along with other components as desired. Any of these etchants as described will provide anisotropic plasma etching of the polymer layer 138 to form spacers 140,142,144,146 on the respective sidewalls 130,132,134, 136 of the bodies 126,128.

Figure 13:
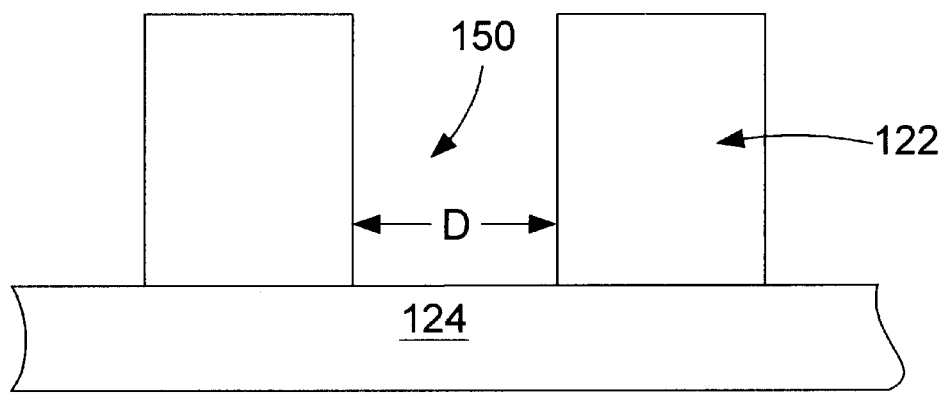
FIG. 13 is a sectional view similar to that shown in FIGS. 10–12 illustrating a further step in the process of the present invention.

Next, an anisotropic plasma etching step of the substrate 122 is undertaken (FIG. 13) using, for example in the case of an oxide substrate, $O_2$, together with one or more of the following: $C_4F_8$, $C_2F_6$, $CF_4$, and/or $CHF_3$. During this step, the adjacent, inner edges of the spacers 142,144 are used as a mask, and etching is undertaken through the substrate 122 from the planer surface thereof. During such etching through the substrate 122, the spacers 142,144 remain on the respective adjacent sidewalls 132,134 of the first and second photoresist bodies. With the dimension D between the spacers 142, 144 being less than the dimension C between the adjacent surfaces 132,134 of the respective photoresist bodies 126,128, the space 150 formed in the substrate 122 will be narrower than as described above, i.e., the dimension D will be smaller than the dimension C, so that a smaller space 150 (of width D) in the substrate 122 is indeed achieved. That is, the spacers 142,144 on the adjacent sidewalls 132,134 of the photoresist bodies 126,128 are closer together than the adjacent sidewalls 132,134 thereof With the spacers 142,144 being used as a mask for etching of the substrate 122, a smaller space 150 in the substrate 122, i.e., a finer dimension of space is achieved.

Then, the spacers 140,142,144,146 and the photoresist bodies 126,128 are simultaneously etched away, using, for example, the same etchant described above for forming the spacers 140,142,144,146 on the photoresist bodies 126,128, and further processing steps are undertaken as is well known.

It will be seen that the numerous problems of the prior art processes described above are overcome. Initially, as compared to the prior art process described with regard to FIGS. 3–6, the bodies 126,128 of the present process are of low aspect ratio, so that deposition of a properly conformal layer can be achieved. Furthermore, the portions of the polymer layer 138 overlying the substrate 122 and the tops of the bodies 126,128 are substantially the same thickness as those portions along the sidewalls 130,132,134,136 of the bodies 126,128, avoiding the etching problems described above. Additionally, the difficulty in depositing a low dielectric over a low k body is avoided. And, it will be seen, the number of process steps is reduced.

Figure 8:
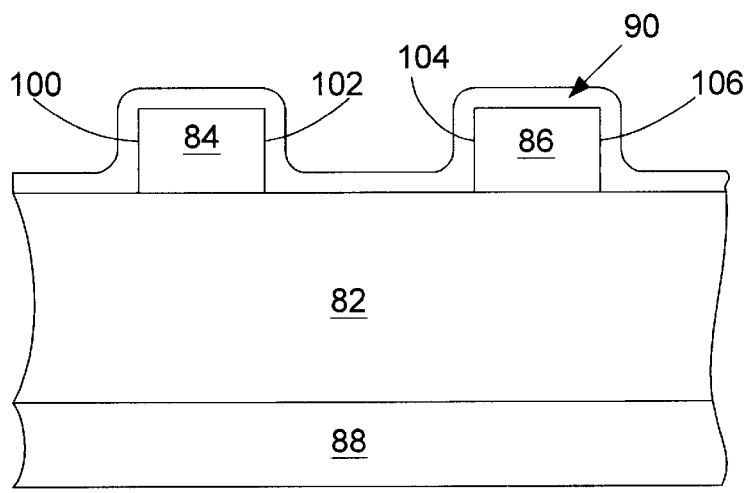
FIG. 8 is a sectional view similar to that shown in FIG. 7 and illustrating a further step in that process.
Figure 9:
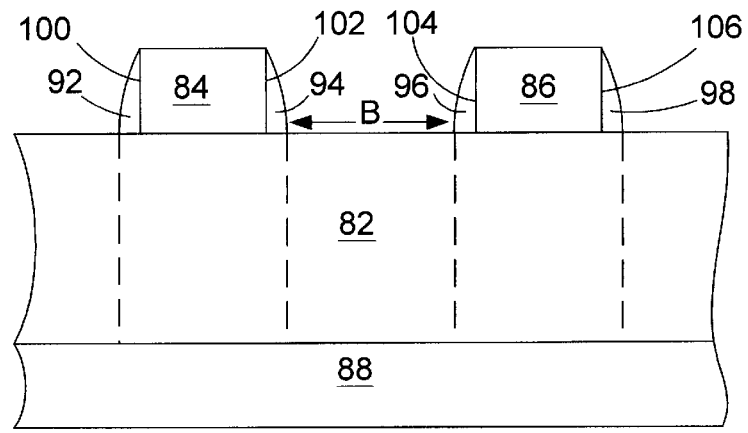
FIG. 9 is a sectional view similar to that shown in FIGS. 7 and 8 and illustrating a further step in that prior art process.

Also with great importance, when compared to the prior art process described with regard to FIGS. 7–9, because of the low temperature involved in the deposition of the polymer layer 138, the photoresist bodies 126,128 will not be damaged or caused to flow during such deposition, and contamination of the oxide deposition chamber will not occur.

The foregoing description of the embodiment of the invention has been presented for purposes of illustration and description. It is not intended to be exhaustive or to limit the invention to the precise form disclosed. Other modifications or variations are possible in light of the above teachings.

The embodiment was chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of fabricating a semiconductor structure comprising:

providing a substrate having a planar surface;

providing a layer of photoresist on the planar surface of substrate;

patterning the photoresist to provide at least first and second photoresist bodies on the planar surface of the substrate, the first and second photoresist bodies having respective adjacent first and second sidewalls;

depositing polymer material over the resulting structure at a temperature of 100° C. or less;

etching the polymer material to form first and second spacers on the respective adjacent first and second sidewalls of the first and second photoresist bodies; and etching through the substrate from the planer surface thereof using the first and second spacers as a mask, the first and second spacers remaining on the respective adjacent first and second sidewalls of the first and second photoresist bodies during etching through the substrate.

2. The method of claim 1 and further comprising the step of providing that the etchant for the polymer material comprises $O_2$ and $N_2$.

3. The method of claim 1 and further comprising the step of providing that the etchant for the polymer material comprises $N_2$ and $H_2$.

* * * * *